United States Patent
Anggraini et al.

(10) Patent No.: US 12,454,491 B2
(45) Date of Patent: Oct. 28, 2025

(54) NITRIDE PIEZOELECTRIC BODY AND MEMS DEVICE USING SAME

(71) Applicant: NATIONAL INSTITUTE OF ADVANCED INDUSTRIAL SCIENCE AND TECHNOLOGY, Tokyo (JP)

(72) Inventors: Sri Ayu Anggraini, Tosu (JP); Morito Akiyama, Tosu (JP); Masato Uehara, Tosu (JP); Hiroshi Yamada, Tosu (JP); Kenji Hirata, Tosu (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 934 days.

(21) Appl. No.: 17/634,224

(22) PCT Filed: Jun. 4, 2020

(86) PCT No.: PCT/JP2020/022048
§ 371 (c)(1),
(2) Date: Feb. 9, 2022

(87) PCT Pub. No.: WO2021/044683
PCT Pub. Date: Mar. 11, 2021

(65) Prior Publication Data
US 2022/0274886 A1  Sep. 1, 2022

(30) Foreign Application Priority Data
Sep. 2, 2019 (JP) .................... 2019-159305

(51) Int. Cl.
C04B 35/581 (2006.01)
H10N 30/00 (2023.01)
(Continued)

(52) U.S. Cl.
CPC .......... *C04B 35/581* (2013.01); *H10N 30/20* (2023.02); *H10N 30/708* (2024.05); *C04B 2235/40* (2013.01); *H10N 30/30* (2023.02)

(58) Field of Classification Search
CPC .................... C04B 35/581; C04B 2235/40
See application file for complete search history.

(56) References Cited

U.S. PATENT DOCUMENTS

2013/0241673 A1  9/2013  Yokoyama et al.
2014/0167560 A1  6/2014  Onda
(Continued)

FOREIGN PATENT DOCUMENTS

JP  2009010926 A  1/2009
JP  2013219743 A  10/2013
(Continued)

OTHER PUBLICATIONS

ISA Japan Patent Office, International Search Report Issued in Application No. PCT/JP2020/022048, Aug. 4, 2020, WIPO, 4 pages.
(Continued)

*Primary Examiner* — J. San Martin
(74) *Attorney, Agent, or Firm* — McCoy Russell LLP (57) ABSTRACT

Provide are a nitride piezoelectric body having a value indicating a performance index (at least any one of $d_{33}$, $g_{33}$, and $K^2$) higher than that of aluminum nitride not doped with any element, and a MEMS device using the same. The nitride piezoelectric body is a piezoelectric body represented by chemical formula $Al_{1-X-Y}Mg_XTa_YN$, wherein X+Y is less than 1, X is in a range of more than 0 and less than 1, and Y is in a range of more than 0 and less than 1, and Ta includes tetravalent tantalum.

11 Claims, 11 Drawing Sheets

(51) Int. Cl.
  *H10N 30/20*   (2023.01)
  *H10N 30/30*   (2023.01)

(56)     References Cited

U.S. PATENT DOCUMENTS

| | | | | |
|---|---|---|---|---|
| 2015/0270026 | A1* | 9/2015 | Izumi | C04B 37/025 |
| | | | | 428/116 |
| 2017/0294894 | A1 | 10/2017 | Aida et al. | |
| 2020/0176667 | A1* | 6/2020 | Kimura | H10N 30/076 |
| 2020/0274051 | A1* | 8/2020 | Kimura | C23C 14/06 |
| 2020/0274052 | A1* | 8/2020 | Kimura | H10N 30/878 |
| 2021/0126185 | A1* | 4/2021 | Kimura | H10N 30/853 |

FOREIGN PATENT DOCUMENTS

| | | | |
|---|---|---|---|
| JP | 2014121025 A | 6/2014 | |
| JP | 5904591 B2 | 4/2016 | |
| WO | 2016111280 A1 | 7/2016 | |

OTHER PUBLICATIONS

Iwazaki, Y. et al., "Highly enhanced piezoelectric property of co-doped AlN," Applied Physics Express, vol. 8, No. 6, May 28, 2015, 4 pages.

Anggraini, S. et al., "Enhancement in piezoelectric responses of AlN thin films by co-addition of Mg and Ta," Materials Chemistry and Physics, vol. 276, Jan. 15, 2022, 6 pages.

* cited by examiner

NITRIDE PIEZOELECTRIC BODY AND MEMS DEVICE USING SAME

CROSS REFERENCE TO RELATED APPLICATIONS

The present application is a U.S. National Phase of International Application No. PCT/JP2020/022048 entitled "NITRIDE PIEZOELECTRIC BODY AND MEMS DEVICE USING SAME," and filed on Jun. 4, 2020. International Application No. PCT/JP2020/022048 claims priority to Japanese Patent Application No. 2019-159305 filed on Sep. 2, 2019. The entire contents of each of the above-listed applications are hereby incorporated by reference for all purposes.

TECHNICAL FIELD

The present disclosure relates to a piezoelectric body of aluminum nitride doped with magnesium and tantalum, and a MEMS device using the same.

BACKGROUND

Devices utilizing the piezoelectric phenomenon have been used in various fields. These devices have been used with increasing frequency in portable devices, such as cellular phones, which are strongly demanded to be more compact and further reduce power consumption. An example of such devices using a piezoelectric phenomenon is a filter using a film bulk acoustic resonator (FBAR), called an FBAR filter.

The FBAR filter is a filter using a resonator in a thickness-longitudinal vibration mode of a thin film exhibiting a piezoelectric response. The FBAR filter has a characteristic in which resonance is possible in a gigahertz band. The FBAR filter having such a characteristic exhibits a low loss, and is operable in a wide band. Thus, the FBAR filter is expected to further contribute to the miniaturization, reduction in power consumption, and increased operability at high frequencies of the portable devices.

Examples of a piezoelectric material for such a piezoelectric thin film used in the FBAR may include scandium-doped aluminum nitride (see Patent Literature 1) and aluminum nitride doped with magnesium and tantalum (Patent Literature 2). In particular, scandium-doped aluminum nitride has a high piezoelectric constant, and is expected to be used in next-generation high frequency filters. Furthermore, scandium-doped aluminum nitride is expected to be used in various micro-electro-mechanical system (MEMS) devices including actuators, microphones, fingerprint authentication sensors, vibration power generators, and physical sensors such as pressure sensors, acceleration sensors, and gyro sensors.

CITATION LIST

Patent Literature

Patent Literature 1: Japanese Patent Application Laid-Open No. 2009-10926
Patent Literature 2: Japanese Patent No. 5904591

SUMMARY

Technical Problem

However, scandium (Sc) is an expensive rare earth element, and its use is problematic in that the production cost of a piezoelectric body including scandium-doped aluminum nitride (AlN) is higher than that of a piezoelectric body including other substances.

Patent Literature 2 discloses a piezoelectric body including aluminum nitride (AlN) doped with magnesium (Mg) and tantalum (Ta), but the piezoelectric body is based on numerical calculation. Specifically, Patent Literature 2 discloses a result of numerical calculation when aluminum nitride is doped with divalent magnesium (12.5 at. %) and pentavalent tantalum (6.25 at. %).

Since the piezoelectric body disclosed in Patent Literature 2 is strictly based on numerical calculation, there is a problem in which the validity of the valence of tantalum used in calculation is suspect. As described below in detail, tantalum contained in a piezoelectric body ($Al_{1-X-Y}Mg_X Ta_Y N$) according to the present disclosure includes not only pentavalent tantalum but also tantalum with other valences, and the piezoelectric body completely differs from the piezoelectric body disclosed in Patent Literature 2.

In view of the circumstances described above, it is an object of the present disclosure to provide a nitride piezoelectric body having a value indicating a performance index (at least any one of $d_{33}$, $g_{33}$, and $K^2$) higher than that of aluminum nitride not doped with any element, and a MEMS device using the nitride piezoelectric body.

Solution to Problem

The inventor of the present disclosure has intensively studied the aforementioned problems, and as a result, found the following novel piezoelectric body of aluminum nitride (AlN) doped with magnesium (Mg) and tantalum (Ta).

A first aspect of the present disclosure for solving the aforementioned problems is a piezoelectric body represented by a chemical formula $Al_{1-X-Y}Mg_X Ta_Y N$ where X+Y is less than 1, X is in a range of more than 0 and less than 1, and Y is in a range of more than 0 and less than 1, and Ta includes tetravalent tantalum.

Herein, a "tetravalent" element refers to an element with a valence of 4. For example, the valence of Ta can be detected by X-ray photoelectron spectroscopy (XPS), X-ray absorption spectroscopy (XANES), TEM-EELS, or the like.

In the first aspect, a nitride piezoelectric body having a value indicating a performance index (at least any one of $d_{33}$, $g_{33}$, and $K^2$) higher than that of aluminum nitride not doped with any element can be provided.

A second aspect of the present disclosure is the piezoelectric body, wherein the tetravalent Ta is contained in a largest amount compared to that of Ta having a valence other than the tetravalent Ta.

In this second aspect, the nitride piezoelectric body can have a value indicating a higher performance index (at least any one of $d_{33}$, $g_{33}$, and $K^2$).

A third aspect of the present disclosure is the piezoelectric body described in the first or second aspect, wherein X/Y is more than 2 and less than or equal to 5.

In this third aspect, the nitride piezoelectric body can have a value indicating a further higher performance index (at least any one of $d_{33}$, $g_{33}$, and $K^2$).

A fourth aspect of the present disclosure is the piezoelectric body described in the first or second aspect, wherein X/Y is more than 2.5 and less than or equal to 4.

In this fourth aspect, the nitride piezoelectric body can have a value indicating a particularly higher performance index (at least any one of $d_{33}$, $g_{33}$, and $K^2$).

A fifth aspect of the present disclosure is the piezoelectric body described in any one of the first to fourth aspects, wherein X+Y is more than 0.0 and less than or equal to 0.4.

In this fifth aspect, the nitride piezoelectric body can have a value indicating a higher performance index (at least any one of $d_{33}$, $g_{33}$, and $K^2$).

A sixth aspect of the present disclosure is the piezoelectric body described in any one of the first to fourth aspects, wherein X+Y is more than or equal to 0.15 and less than or equal to 0.35.

In this sixth aspect, the nitride piezoelectric body can have a value indicating a further higher performance index (at least any one of $d_{33}$, $g_{33}$, and $K^2$).

A seventh aspect of the present disclosure is a piezoelectric body including the piezoelectric body described in any one of the first to sixth aspects that is disposed on a substrate, wherein at least one intermediate layer is disposed between the piezoelectric body and the substrate.

In this seventh aspect, the nitride piezoelectric body can have a value indicating a higher performance index (at least any one of $d_{33}$ and $g_{33}$) because of improved crystallinity (degree of crystallization) of the piezoelectric body.

An eighth aspect of the present disclosure is the piezoelectric body described in the seventh aspect, wherein the intermediate layer contains at least one of aluminum nitride, gallium nitride, indium nitride, titanium nitride, scandium nitride, ytterbium nitride, molybdenum, tungsten, hafnium, titanium, ruthenium, ruthenium oxide, chromium, chromium nitride, platinum, gold, silver, copper, aluminum, tantalum, iridium, palladium, and nickel.

In this eighth aspect, the nitride piezoelectric body can have a value indicating the higher performance index (at least any one of $d_{33}$, $g_{33}$, and $K^2$) because of improved crystallinity (degree of crystallization) of the piezoelectric body.

A ninth aspect of the present disclosure is the piezoelectric body described in the seventh or eighth aspect, wherein a diffusion layer, containing both a substance constituting the intermediate layer and a substance constituting the piezoelectric body, is further disposed between the intermediate layer and the piezoelectric body.

In this ninth aspect, the nitride piezoelectric body can have a value indicating a high performance index (at least any one of $d_{33}$, $g_{33}$, and $K^2$), similar to the seventh and eighth aspects.

A tenth aspect of the present disclosure is a MEMS device using the piezoelectric body described in any one of the first to ninth aspects.

The "MEMS device" used herein is not particularly limited as long as it is a micro electromechanical system, and examples thereof may include FBAR filters, actuators, microphones, fingerprint authentication sensors, vibration power generators, energy harvesters, and physical sensors such as pressure sensors, acceleration sensors, and gyro sensors.

In this tenth aspect, a MEMS device that is operable at a high frequency, is compact, and has low power consumption can be provided. In particular, when the MEMS device is a high frequency filter, a high frequency filter that has a lower loss and is operable in a wider band compared to a conventional high frequency filter can be provided.

DETAILED DESCRIPTION

Hereinafter, embodiments relating to a thin film of a piezoelectric body according to the present disclosure will be described with reference to the accompanying drawings. Needless to say the present disclosure is not limited to the following embodiments and the shape thereof is not particularly limited, so the piezoelectric body may not be in a thin film shape.

First Embodiment

Figure 1:
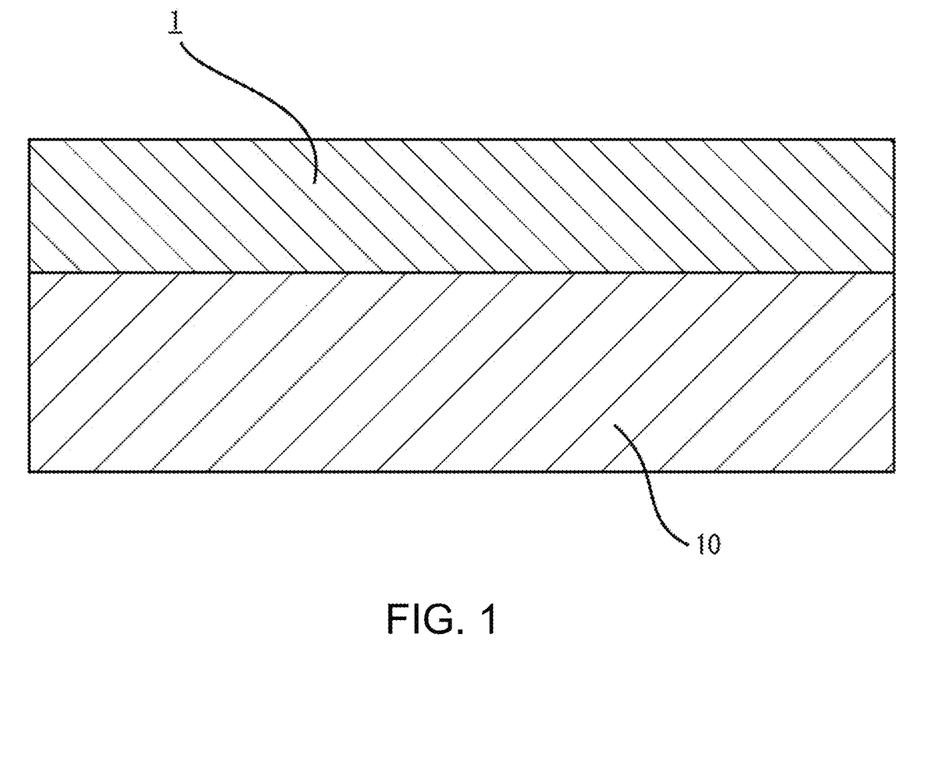
FIG. 1 is a schematic cross-sectional view of a piezoelectric thin film according to a first embodiment.

FIG. 1 is a schematic cross-sectional view of a piezoelectric thin film according to the embodiment. As illustrated in FIG. 1, a piezoelectric thin film 1 is formed on a substrate 10. The thickness of the piezoelectric thin film 1 is not particularly limited, and may be in a range of 0.1 to 30 μm, or particularly in a range of 0.1 to 2 μm in the interest of achieving excellent adhesion.

The thickness, material, and the like of the substrate 10 are not particularly limited as long as the piezoelectric thin film 1 can be formed on a surface of the substrate 10. Examples of the substrate 10 may include a silicon substrate, a substrate of a heat resistant alloy such as Inconel, and a film of a resin such as a polyimide.

The piezoelectric thin film 1 is represented by a chemical formula $Al_{1-X-Y}Mg_XTa_YN$ wherein X+Y is less than 1, X is in a range of more than 0 and less than 1, and Y is in a range of more than 0 and less than 1; the piezoelectric thin film 1 includes aluminum nitride (AlN) doped with magnesium (Mg) and tantalum (Ta). The piezoelectric thin film 1 contains tetravalent Ta. The valence of Ta can be detected by X-ray photoelectron spectroscopy (XPS) or the like.

The piezoelectric thin film 1 having such a configuration has a value indicating a performance index (at least any one of $d_{33}$, $g_{33}$, and $K^2$) higher than that of aluminum nitride not doped with any element.

Herein, Ta may contain Ta having a valence other than the tetravalent Ta (for example, trivalent and pentavalent Ta).

However, the piezoelectric thin film in which the content of tetravalent Ta is higher than that of Ta having a valence other than the tetravalent Ta is preferred. The piezoelectric thin film 1 having such a configuration has a value indicating a higher performance index (at least any one of $d_{33}$, $g_{33}$, and $K^2$).

When the content percentage of tetravalent Ta is 30% or more in Ta contained in the piezoelectric thin film 1, the piezoelectric thin film 1 has a value indicating a higher performance index (at least any one of $d_{33}$, $g_{33}$, and $K^2$). When the content percentage of tetravalent Ta is 45% or more, the piezoelectric thin film 1 has a value indicating a further higher performance index (at least any one of $d_{33}$, $g_{33}$, and $K^2$). When the content percentage of tetravalent Ta is 50% or more, the piezoelectric thin film 1 has a value indicating a particularly higher performance index (at least any one of $d_{33}$, $g_{33}$, and $K^2$).

The piezoelectric thin film 1 represented by the aforementioned chemical formula wherein X/Y is more than 2 and less than or equal to 5 is preferred. The piezoelectric thin film 1 having such a configuration has a value indicating a further higher performance index (at least any one of $d_{33}$, $g_{33}$, and $K^2$).

The piezoelectric thin film 1 represented by the aforementioned chemical formula wherein X/Y is more than 2.5 and less than or equal to 4 is more preferred. The piezoelectric thin film 1 having such a configuration has a value indicating a particularly high performance index (at least any one of $d_{33}$, $g_{33}$, and $K^2$).

The piezoelectric thin film 1 represented by the aforementioned chemical formula wherein X+Y is more than 0.0 and less than or equal to 0.4 is more preferred. The piezoelectric thin film 1 having such a configuration has a value indicating a higher performance index (at least any one of $d_{33}$, $g_{33}$, and $K^2$).

The piezoelectric thin film 1 represented by the aforementioned chemical formula wherein X+Y is more than or equal to 0.15 and less than or equal to 0.35 is further more preferred. The piezoelectric thin film 1 having such a configuration has a value indicating a further higher performance index (at least any one of $d_{33}$, $g_{33}$, and $K^2$).

The piezoelectric thin film 1 represented by the aforementioned chemical formula wherein X+Y is more than or equal to 0.2 and less than or equal to 0.3 is particularly preferred. The piezoelectric thin film 1 having such a configuration has a value indicating a particularly high performance index (at least any one of $d_{33}$, $g_{33}$, and $K^2$).

A high frequency filter using the piezoelectric thin film 1 has a lower loss and is operable in a wider band compared to a conventional high frequency filter. Therefore, a portable device can operate at a higher frequency, be more compact, and be more reduced power consumption. The configuration of the high frequency filter is not particularly limited, and a high frequency filter having a publicly known configuration can be produced.

Next, a method for producing the piezoelectric thin film 1 according to the embodiment will be described. The piezoelectric thin film 1 can be produced by a production method such as a sputtering method or a deposition method, similar to how a general piezoelectric thin film is produced. Specifically, the piezoelectric thin film 1 can be produced by simultaneously sputtering a target constituted by tantalum, a target constituted by magnesium, and a target constituted by aluminum (Al) on the substrate 10 (for example, a silicon (Si) substrate) under a nitrogen gas ($N_2$) atmosphere or a mixed atmosphere containing a nitrogen gas ($N_2$) and an argon gas (Ar) (a gas pressure of 1 Pa or less). As a target, an alloy containing tantalum, magnesium, and aluminum at a predetermined ratio may be used.

A layer containing both a substance constituting the substrate and a substance constituting the piezoelectric thin film may be formed between the substrate and the piezoelectric thin film. For example, such a layer can be formed by heating the substrate and the piezoelectric thin film after formation of the piezoelectric thin film on the substrate.

EXAMPLES

A piezoelectric thin film ($Al_{1-X-Y}Mg_XTa_YN$) of aluminum nitride doped with tantalum and magnesium, having a thickness of 0.4 to 1.5 μm was produced on an n-type silicon substrate having a specific resistance of 0.02 Ωcm using the following apparatus and sputtering targets, and the like.

Multi-target simultaneous sputter system (manufactured by EIKO Corporation)

Tantalum sputtering target material (concentration: 99.999%)

Magnesium sputtering target material (concentration: 99.999%)

Aluminum sputtering target material (concentration: 99.999%)

Gas: mixed gas of nitrogen (purity: 99.99995% or more) and argon gas (purity: 99.9999% or more) (mixing ratio: 50:50)

Substrate heating temperature: 500° C.

Film-forming experiments were performed after the air pressure in a sputter chamber was decreased to a high vacuum of $10^{-6}$ or less with a vacuum pump. In order to prevent contamination with impurities such as oxygen, a target surface was subjected to a cleaning treatment immediately after installation of a target and immediately before each of the film-forming experiments.

Figure 2:
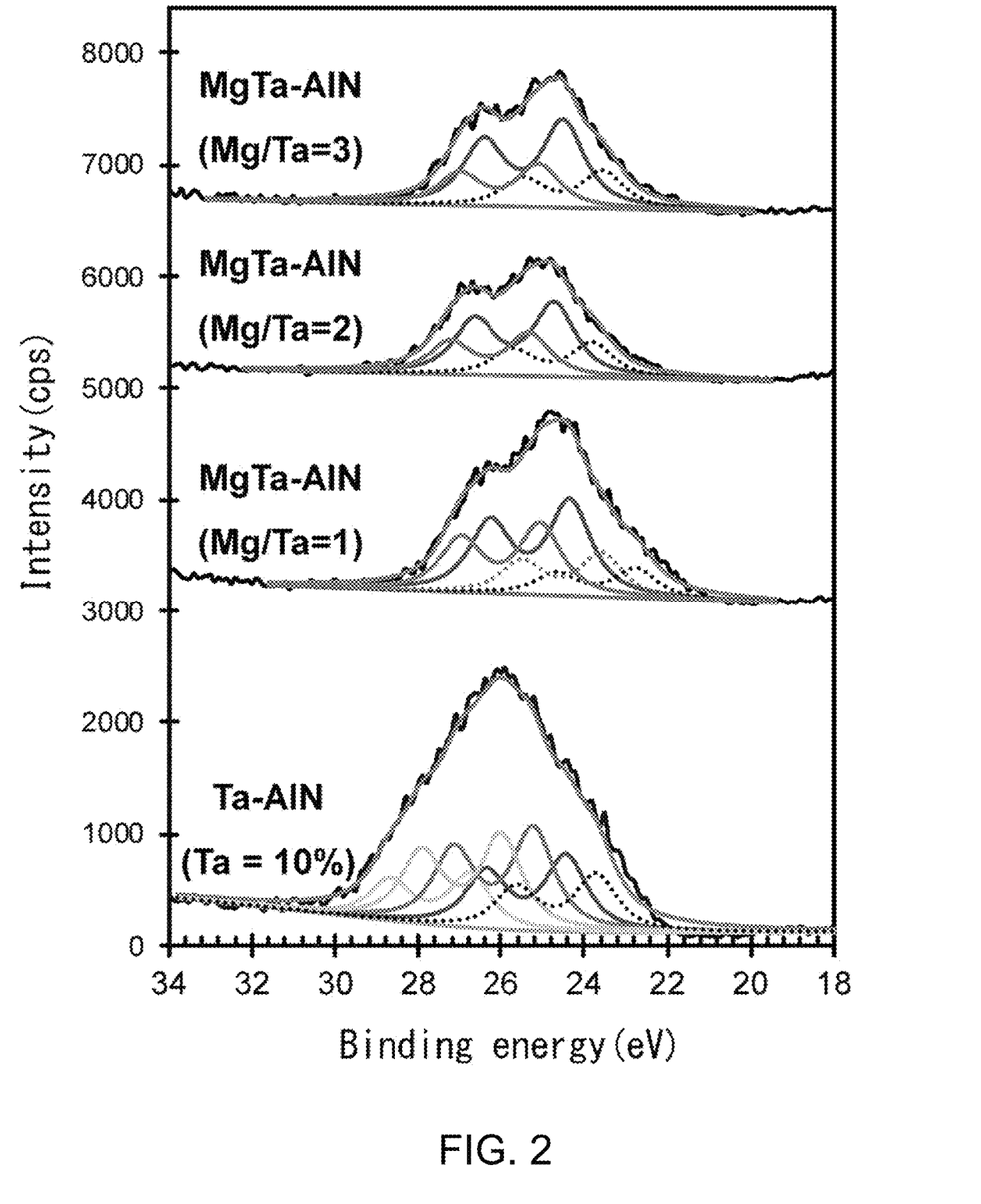
FIG. 2 is a graph showing the relation between the binding energy and the intensity in each piezoelectric thin film.
Figure 3:
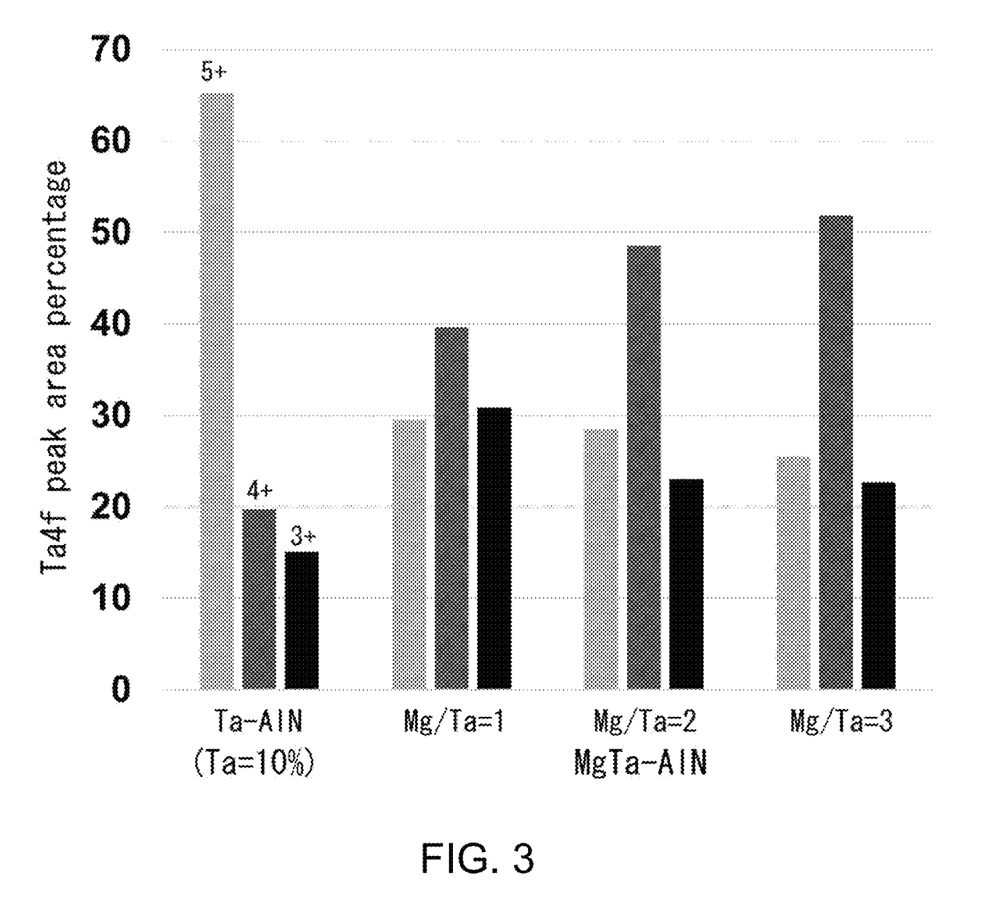
FIG. 3 is a graph showing the relation between the molar ratio of magnesium to tantalum and the peak area percentage of the 4f orbital of tantalum.

FIG. 2 shows the relation between the binding energy and the intensity in each of the obtained piezoelectric thin films during measurement with XPS (AXIS-165 manufactured by Shimadzu Corporation and Kratos Analytical Ltd.). FIG. 3 shows the relation between the molar ratio of magnesium to tantalum and the peak area percentage of the 4f orbital of tantalum. As can be seen from FIGS. 2 and 3, it was found that as the ratio of magnesium to tantalum (Mg/Ta), where Mg and Ta are expressed in atomic percent, increases, the proportions of $Ta^{5+}$ and $Ta^{3+}$ decrease, but the proportion of $Ta^{4+}$ increases. It was also found that the proportion of the number of atoms of $Ta^{4+}$ is higher than those of $Ta^{5+}$ and $Ta^{3+}$ within a range of 1 Mg/Ta≤3.

Figure 4:
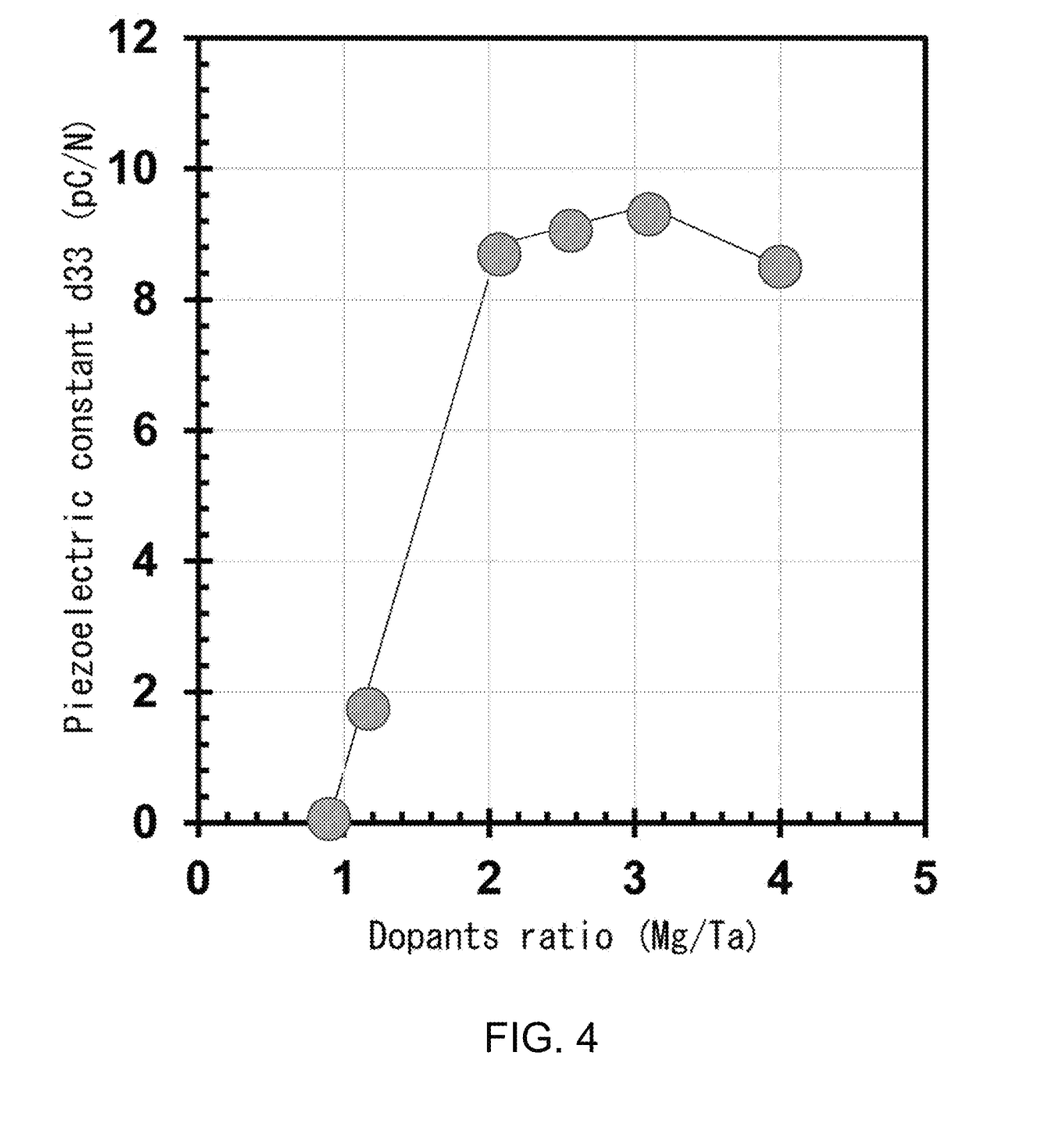
FIG. 4 is a graph showing the relation between the ratio of Mg/Ta, where Mg and Ta are expressed in atomic percent, and a piezoelectric constant $d_{33}$.

FIG. 4 shows the relation between the ratio of Mg/Ta, where Mg and Ta are expressed in atomic percent, and a piezoelectric constant $d_{33}$ when the concentration of dopants (Mg+Ta) is 15 to 26 at. %. As can be seen from FIG. 4, as Mg/Ta increases beyond 1 but not yet to 3.1, the value of piezoelectric constant $d_{33}$ increases. When Mg/Ta is 3.1, the value of piezoelectric constant $d_{33}$ is the maximum. As Mg/Ta increases beyond 3.1, the value of piezoelectric constant $d_{33}$ decreases. The piezoelectric constant $d_{33}$ was measured with a piezometer (Piezotest PM300 manufactured by Alpha Corporation).

Figure 5:
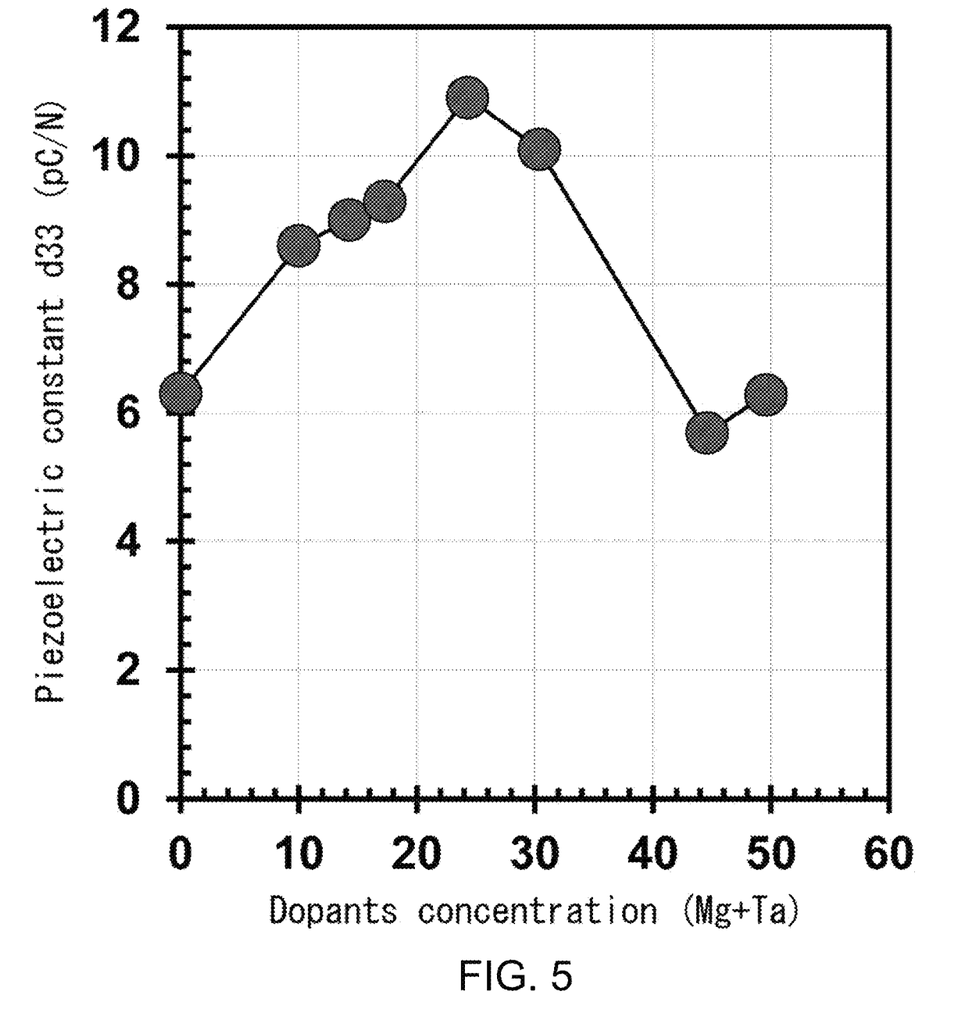
FIG. 5 is a graph showing the relation between the concentration of dopants (Mg+Ta) and a piezoelectric constant $d_{33}$.

FIG. 5 shows the relation between the concentration of dopants (Mg+Ta) and the piezoelectric constant $d_{33}$. Here, the ratio of Mg/Ta, where Mg and Ta are expressed in atomic percent, was fixed to 3.1. As can be seen from FIG. 5, as the concentration of dopants (Mg+Ta) increases, the value of piezoelectric constant $d_{33}$ increases, and when the concentration is 24.3 at. %, the value of piezoelectric constant $d_{33}$ is the maximum. When the concentration of dopants (Mg+

Ta) is 0, the value of piezoelectric constant $d_{33}$ is that of aluminum nitride not doped with any element.

Figure 6:
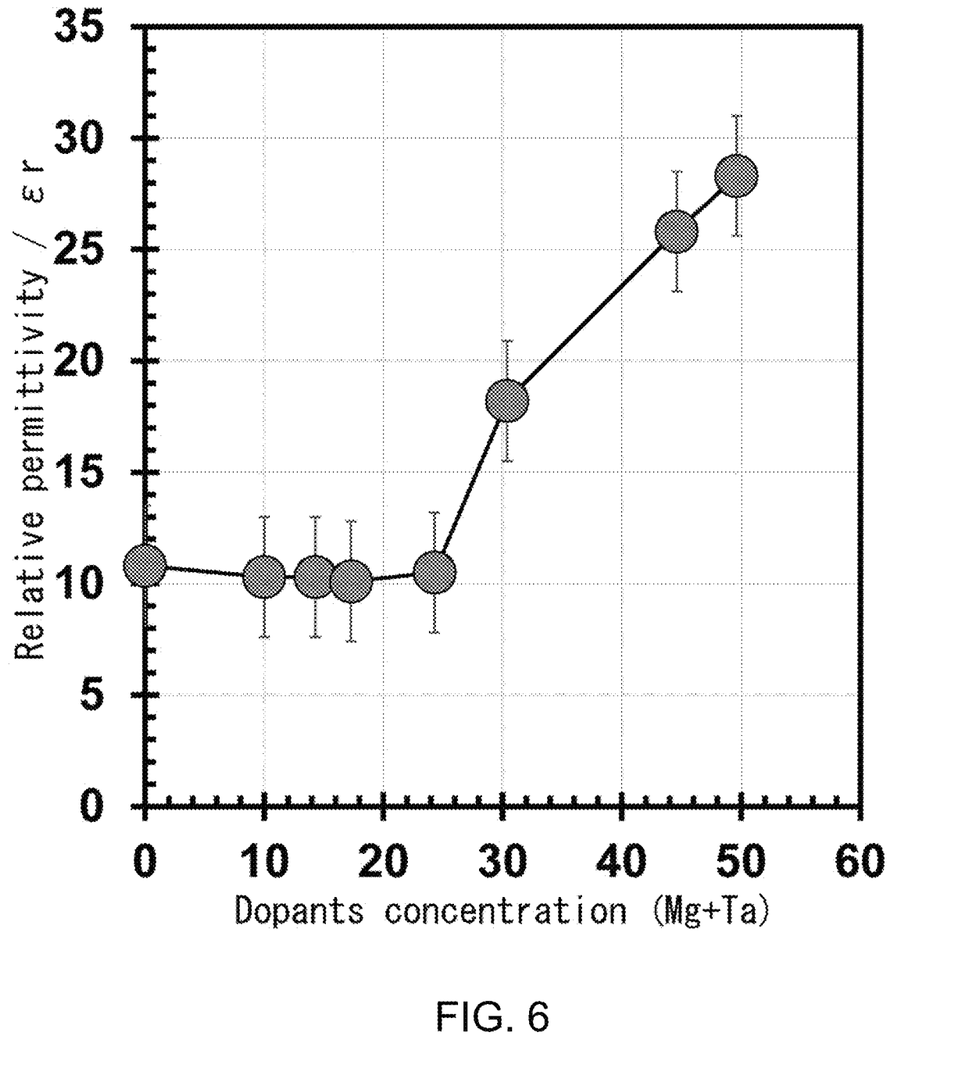
FIG. 6 is a graph showing the relation between the concentration of dopants (Mg+Ta) and a relative permittivity $\varepsilon_r$.

FIG. 6 shows the relation between the concentration of dopants (Mg+Ta) and a relative permittivity $\varepsilon_r$. Here, the ratio of Mg/Ta, where Mg and Ta are expressed in atomic percent, was fixed to 3.1. As can be seen from FIG. 6, the relative permittivity $\varepsilon_r$ is nearly constant ($\varepsilon_r=10$) until the concentration of dopants (Mg+Ta) reaches 24.3 at. %, but as the concentration increases beyond 24.3 at. %, the value of relative permittivity $\varepsilon_r$ increases.

The piezoelectric voltage constant $g_{33}$ was calculated from the aforementioned data using the following expression. Herein, $\varepsilon_0=8.8542e^{-12}$ was used.

$$g_{33} = \frac{d_{33}}{\varepsilon_{33}} = \frac{d_{33}}{\varepsilon_r \varepsilon_0} \quad \text{[Expression 1]}$$

Figure 7:
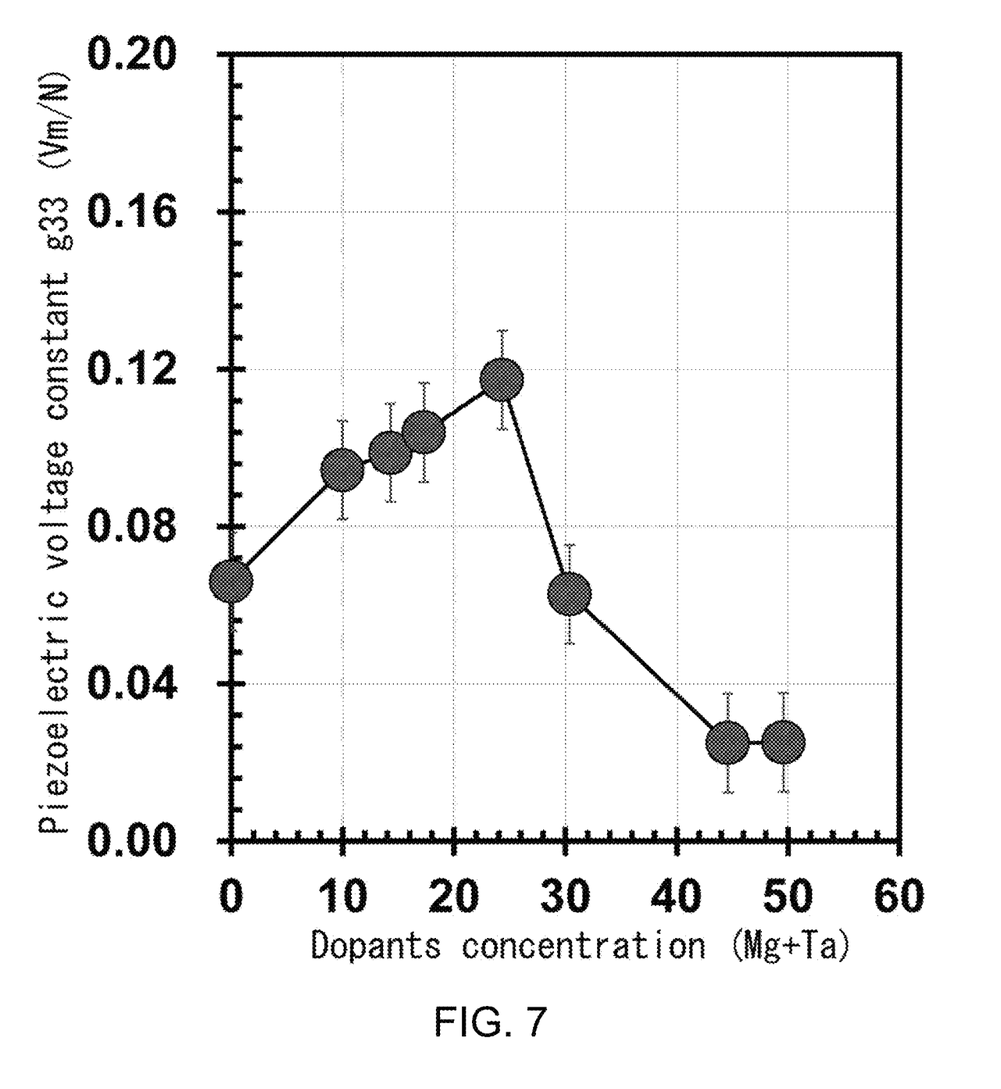
FIG. 7 is a graph showing the relation between the concentration of dopants (Mg+Ta) and a piezoelectric voltage constant $g_{33}$.

FIG. 7 shows the relation between the obtained piezoelectric voltage constant $g_{33}$ and the concentration of dopants (Mg+Ta). Here, the ratio of Mg/Ta, where Mg and Ta are expressed in atomic percent, was fixed to 3.1. From FIG. 7, as the concentration of dopants (Mg+Ta) increases initially, the value of piezoelectric voltage constant $g_{33}$ increases, and when the concentration is 24.3 at. %, the value of piezoelectric voltage constant $g_{33}$ is the maximum. It was also found that as the concentration of dopants (Mg+Ta) increases beyond 24.3 at. %, the value of piezoelectric voltage constant $g_{33}$ decreases. When the concentration of dopants (Mg+Ta) is 0, the value of piezoelectric voltage constant $g_{33}$ is that of aluminum nitride not doped with any element.

Figure 8:
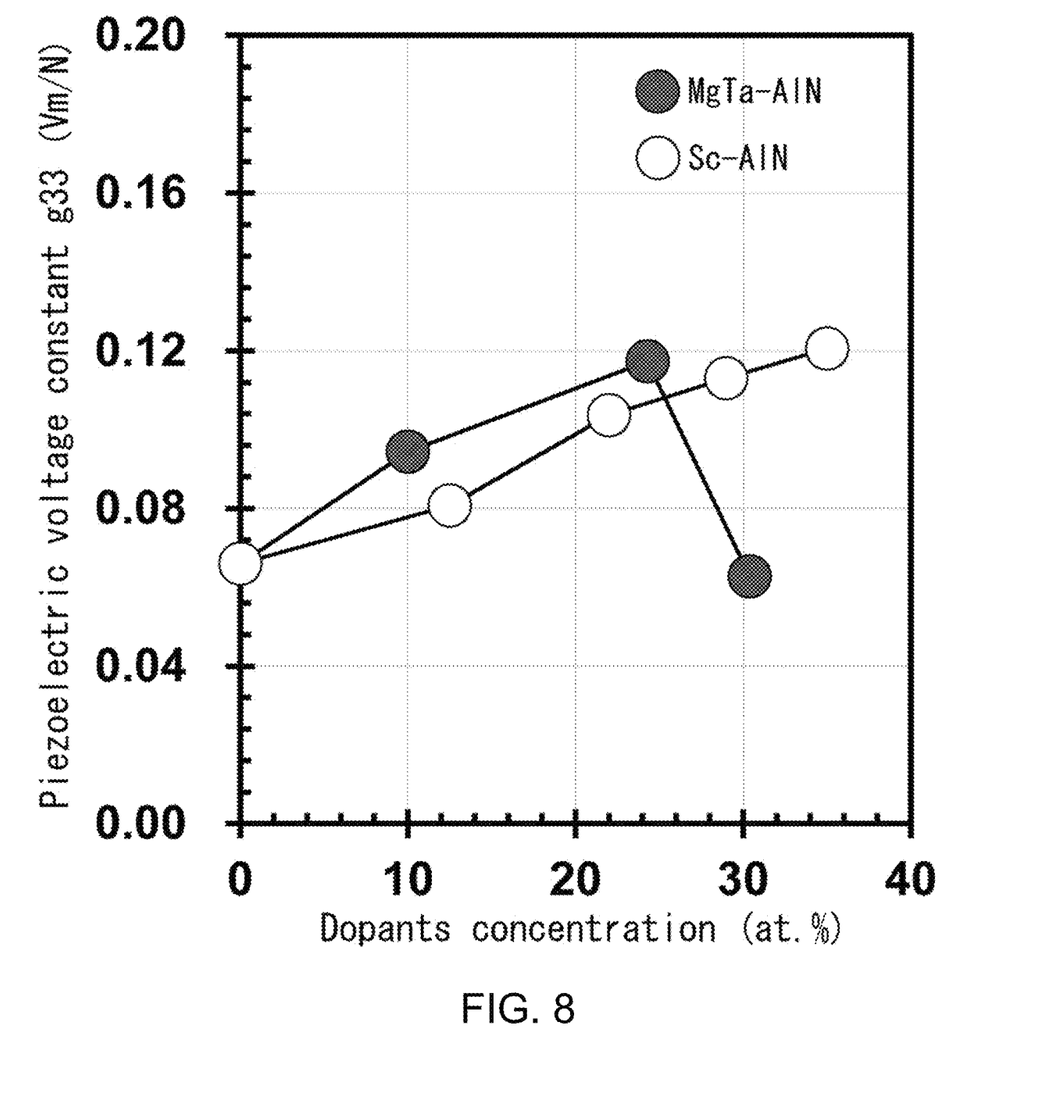
FIG. 8 is a graph showing the relation between the concentration of dopants (Mg+Ta, and Sc) and a piezoelectric voltage constant $g_{33}$.

FIG. 8 shows the relation between the concentrations of dopants (Mg+Ta, and Sc) and the piezoelectric voltage constant $g_{33}$. As can be seen from FIG. 8, the piezoelectric thin film ($Al_{1-X-Y}Mg_XTa_YN$) of aluminum nitride doped with tantalum and magnesium has a piezoelectric voltage constant $g_{33}$ higher than that of the piezoelectric thin film ($Al_{1-X-Y}Mg_XTa_YN$) of aluminum nitride doped with scandium until the concentration of dopants reaches 24.3 at. %.

Therefore, it was found that the piezoelectric thin film of this Example has a value indicating a high performance index ($d_{33}$ and $g_{33}$) compared to aluminum nitride not doped with any element when the ratio of Mg/Ta, where Mg and Ta are expressed in atomic percent, is in a range of more than 1 and less than or equal to 4 and the concentration of dopants (Mg+Ta) is in a range of more than 0.0 and less than or equal to 0.4.

Figure 9:
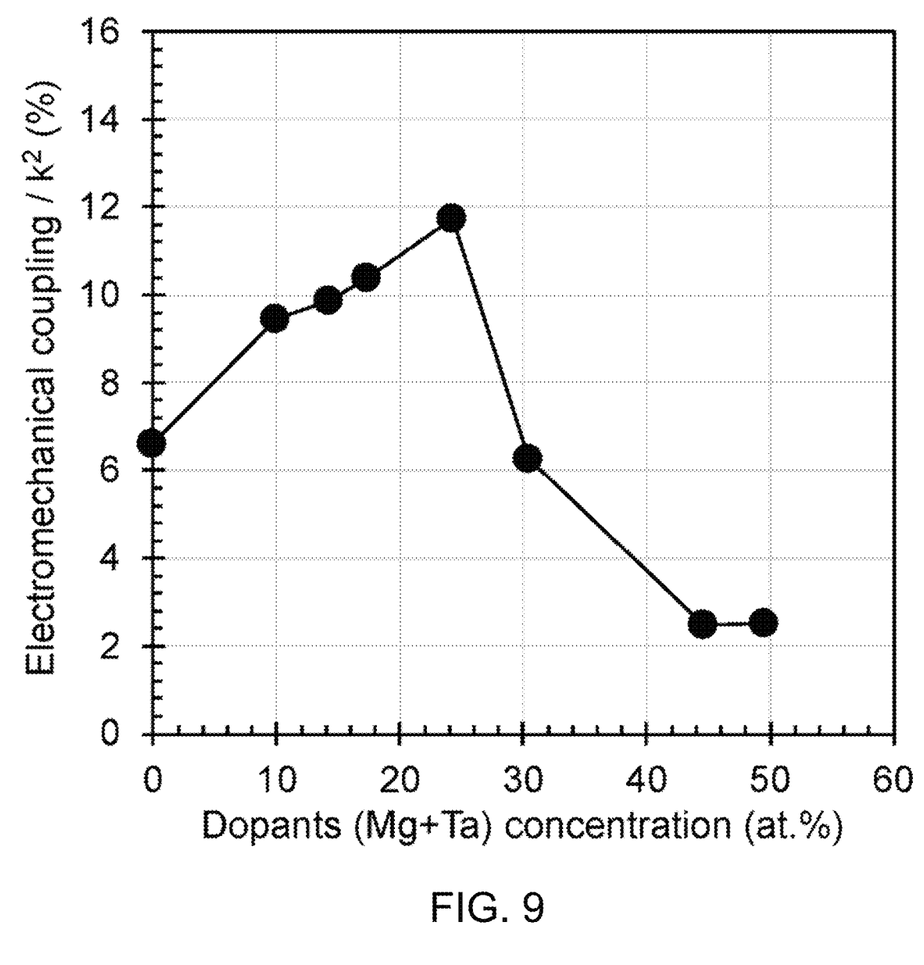
FIG. 9 is a graph showing the relation between the concentration of dopants (Mg+Ta, and Sc) and an electromechanical coupling constant $K^2$.

FIG. 9 shows the relation between the concentration of dopants (Mg+Ta) and an electromechanical coupling constant $K^2$. From FIG. 9, as the concentration of dopants (Mg+Ta) increases initially, the value of electromechanical coupling constant $K^2$ increases, and when the concentration is 24.3 at. %, the value of piezoelectric voltage constant $g_{33}$ is the maximum. It was found that as the concentration of dopants (Mg+Ta) increases beyond 24.3 at. %, the value of piezoelectric voltage constant $g_{33}$ decreases. The electromechanical coupling constant $K^2$ can be calculated using the following expression.

$$k^2 = e_{33} \times g_{33} \quad \text{[Expression 2]}$$

Note that $e_{33}$ represents a piezoelectric stress coefficient, and calculation was performed using a software Vienna Ab initio Simulation Package (VASP) in which a calculation method referred to as "first-principle calculation" was adapted.

Second Embodiment

Figure 10:
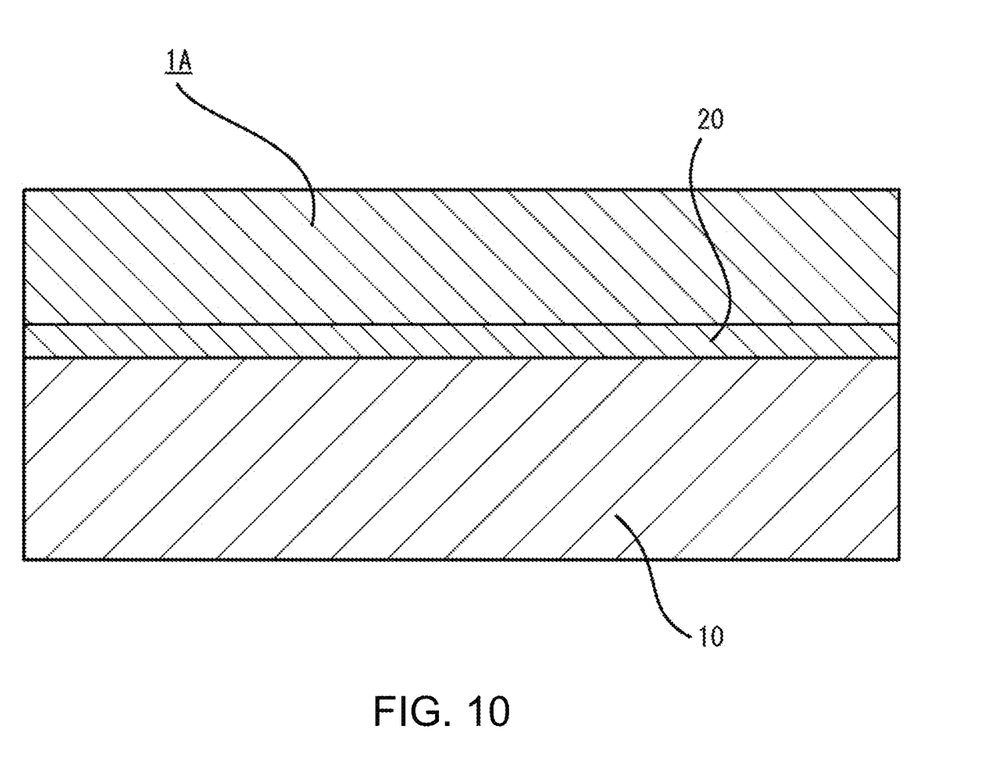
FIG. 10 is a schematic cross-sectional view of a piezoelectric thin film according to a second embodiment.

In the aforementioned first embodiment, the piezoelectric thin film is produced directly on the substrate. However, the present disclosure is not limited to the embodiment. For example, as illustrated in FIG. 10, an intermediate layer 20 may be disposed between the substrate 10 and a piezoelectric thin film 1A.

Herein, the material, thickness, and the like of the intermediate layer 20 are not particularly limited as long as the piezoelectric thin film 1A can be formed on the intermediate layer 20. As the intermediate layer, those constituted by aluminum nitride (AlN), gallium nitride (GaN), indium nitride (InN), titanium nitride (TiN), scandium nitride (ScN), ytterbium nitride (YbN), molybdenum (Mo), tungsten (W), hafnium (Hf), titanium (Ti), ruthenium (Ru), ruthenium oxide (RuO$_2$), chromium (Cr), chromium nitride (CrN), platinum (Pt), gold (Au), silver (Ag), copper (Cu), aluminum (Al), tantalum (Ta), iridium (Ir), palladium (Pd), and nickel (Ni), having a thickness of 50 to 200 nm, may be mentioned, for example.

When such an intermediate layer 20 is disposed on the substrate 10, the crystallinity (degree of crystallization) of the piezoelectric thin film 1A improves. A piezoelectric thin film ($Al_{1-X-Y}Mg_XTa_YN$) of aluminum nitride doped with tantalum and magnesium having a performance index (at least any one of $d_{33}$, $g_{33}$, and $K^2$) much higher than that of the piezoelectric thin film of the first embodiment can be formed.

Third Embodiment

Figure 11:
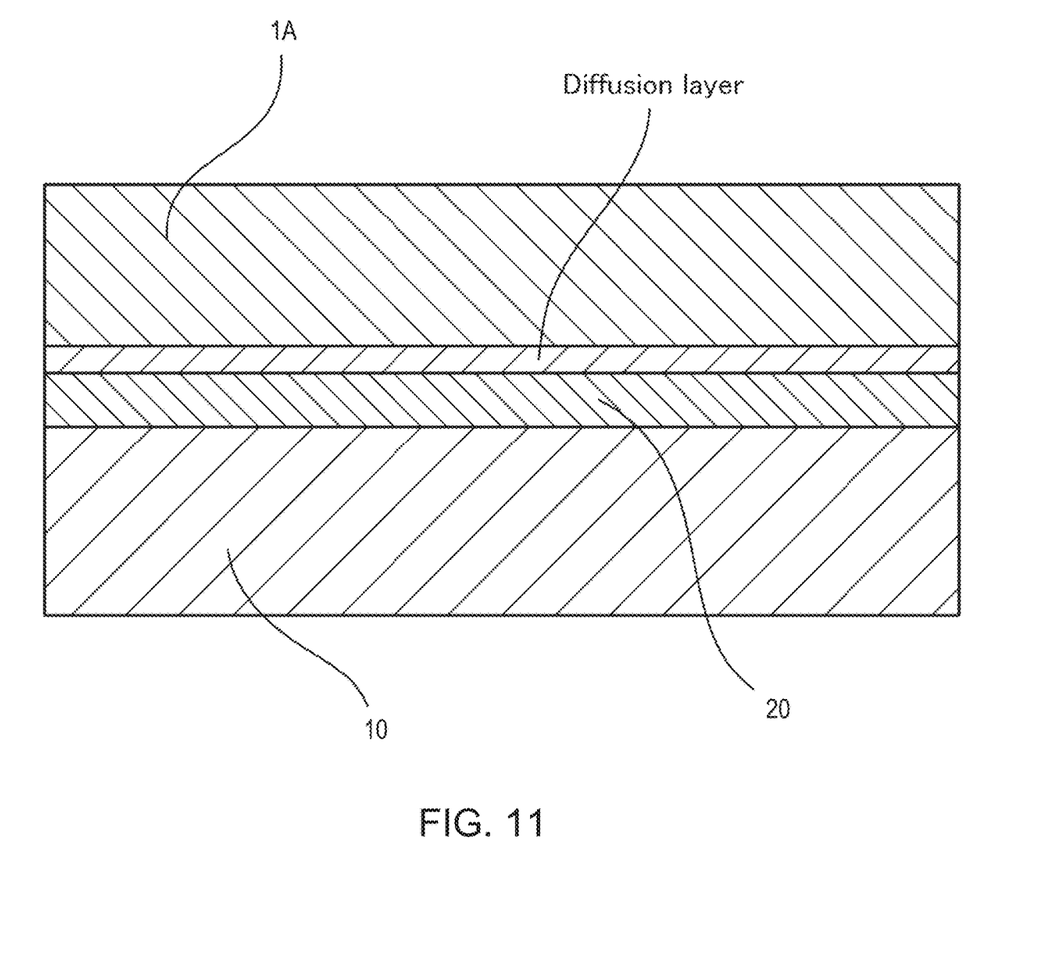
FIG. 11 is a schematic drawing of a diffusion layer.

In the aforementioned second embodiment, the piezoelectric thin film is formed directly on the intermediate layer. However, the present disclosure is not limited to the embodiment. For example, a diffusion layer containing both a substance constituting the intermediate layer and a substance constituting the piezoelectric thin film may be further disposed between the intermediate layer and the piezoelectric thin film. For example, the diffusion layer can be formed by heating the piezoelectric thin film and the intermediate layer after formation of the piezoelectric thin film on the intermediate layer. The same effects as those in the second embodiment can be achieved even when the diffusion layer is thus disposed.

REFERENCE SIGNS LIST 1, 1A piezoelectric thin film
10 substrate
20 intermediate layer

The invention claimed is:

1. A nitride material represented by a chemical formula $Al_{1-X-Y}Mg_XTa_YN$ where X+Y is less than 1, X is in a range of more than 0 and less than 1, and Y is in a range of more than 0 and less than 1,
and Ta includes tetravalent tantalum, and
the tetravalent Ta is contained in a largest amount compared to that of Ta having a valence other than the tetravalent Ta.

2. A nitride material represented by a chemical formula $Al_{1-X-Y}Mg_XTa_YN$, wherein
X+Y is less than 1, X is in a range of more than 0 and less than 1, and Y is in a range of more than 0 and less than 1,
Ta includes tetravalent tantalum, and
X/Y is more than 2 and less than or equal to 5.

3. The nitride material according to claim 1, wherein X/Y is more than 2.5 and less than or equal to 4.

4. The nitride material according to claim 1, wherein X+Y is more than 0.0 and less than or equal to 0.4.

5. The nitride material according to claim 1, wherein X+Y is more than or equal to 0.15 and less than or equal to 0.35.

6. A piezoelectric body comprising the nitride material according to claim 1.

7. A piezoelectric body comprising the piezoelectric body according to claim 6 that is disposed on a substrate, wherein at least one intermediate layer is disposed between the piezoelectric body and the substrate.

8. The piezoelectric body according to claim 7, wherein the intermediate layer contains at least one of aluminum nitride, gallium nitride, indium nitride, titanium nitride, scandium nitride, ytterbium nitride, molybdenum, tungsten, hafnium, titanium, ruthenium, ruthenium oxide, chromium, chromium nitride, platinum, gold, silver, copper, aluminum, tantalum, iridium, palladium, and nickel.

9. The piezoelectric body according to claim 7, wherein a diffusion layer, containing both a substance constituting the intermediate layer and a substance constituting the piezoelectric body, is further disposed between the intermediate layer and the piezoelectric body.

10. A MEMS device using the piezoelectric body according to claim 6.

11. A MEMS device using the piezoelectric body according to claim 7.

* * * * *